(12) United States Patent
Lin et al.

(10) Patent No.: US 12,500,115 B2
(45) Date of Patent: Dec. 16, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Wen-Kai Lin, Yilan County (TW); Chi-Horn Pai, Tainan (TW); Sheng-Yuan Hsueh, Tainan (TW); Kuo-Hsing Lee, Hsinchu County (TW); Chih-Kai Kang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 471 days.

(21) Appl. No.: 18/074,511

(22) Filed: Dec. 4, 2022

(65) Prior Publication Data
US 2024/0153812 A1    May 9, 2024

(30) Foreign Application Priority Data

Nov. 4, 2022  (TW) .................................. 111142101

(51) Int. Cl.
| | |
|---|---|
| H01L 21/768 | (2006.01) |
| H01L 21/762 | (2006.01) |
| H01L 23/485 | (2006.01) |
| H10D 30/01 | (2025.01) |
| H10D 30/62 | (2025.01) |
| H10D 64/01 | (2025.01) |

(52) U.S. Cl.
CPC ...... *H01L 21/762* (2013.01); *H01L 21/76831* (2013.01); *H01L 21/76897* (2013.01); *H10D 64/017* (2025.01)

(58) Field of Classification Search
CPC ............. H10D 30/0281; H10D 30/603; H10D 30/0618; H10D 30/65; H10D 30/795; H10D 30/601; H10D 30/022; H10D 30/0227; H10D 30/6721; H10D 30/6715; H10D 62/115; H10D 62/116; H10D 84/0151; H10D 84/0188; H10D 64/251; H10D 64/257; H10D 64/258; H10D 64/259; H10D 30/6729; H10D 30/673; H10D 30/6219; H10D 64/647; H10D 30/0212; H10D 84/013; H10D 84/0133; H10D 84/017; H10D 62/149; H10D 62/152; H10D 84/83125; H10D 64/256; H10D 84/0149; H10D 84/0186; H01L 21/762; H01L 21/76224; H01L 21/76283; H10K 10/84

See application file for complete search history.

(56) References Cited

U.S. PATENT DOCUMENTS

| | | |
|---|---|---|
| 2006/0125019 A1 | 6/2006 | Levin et al. |
| 2013/0001734 A1 | 1/2013 | Yang et al. |
| 2018/0033888 A1* | 2/2018 | Chen .................. H10D 30/0281 |

* cited by examiner

*Primary Examiner* — Sonya McCall-Shepard
(74) *Attorney, Agent, or Firm* — Winston Hsu

(57) ABSTRACT

A method for fabricating a semiconductor device includes the steps of first forming a shallow trench isolation (STI) in a substrate, forming a first gate structure on the substrate and adjacent to the STI, forming a first doped region between the first gate structure and the STI, forming a second doped region between the first doped region and the first gate structure, forming a first contact plug on the first doped region, and then forming a second contact plug on the second doped region.

10 Claims, 6 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of fabricating Schottky diode.

2. Description of the Prior Art

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

SUMMARY OF THE INVENTION

According to an embodiment of the present invention, a method for fabricating a semiconductor device includes the steps of first forming a shallow trench isolation (STI) in a substrate, forming a first gate structure on the substrate and adjacent to the STI, forming a first doped region between the first gate structure and the STI, forming a second doped region between the first doped region and the first gate structure, forming a first contact plug on the first doped region, and then forming a second contact plug on the second doped region.

According to another aspect of the present invention, a semiconductor device includes a shallow trench isolation (STI) in a substrate, a first gate structure on the substrate and adjacent to the STI, a first doped region between the first gate structure and the STI, a second doped region between the first doped region and the first gate structure, a first contact plug on the first doped region, and a second contact plug on the second doped region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
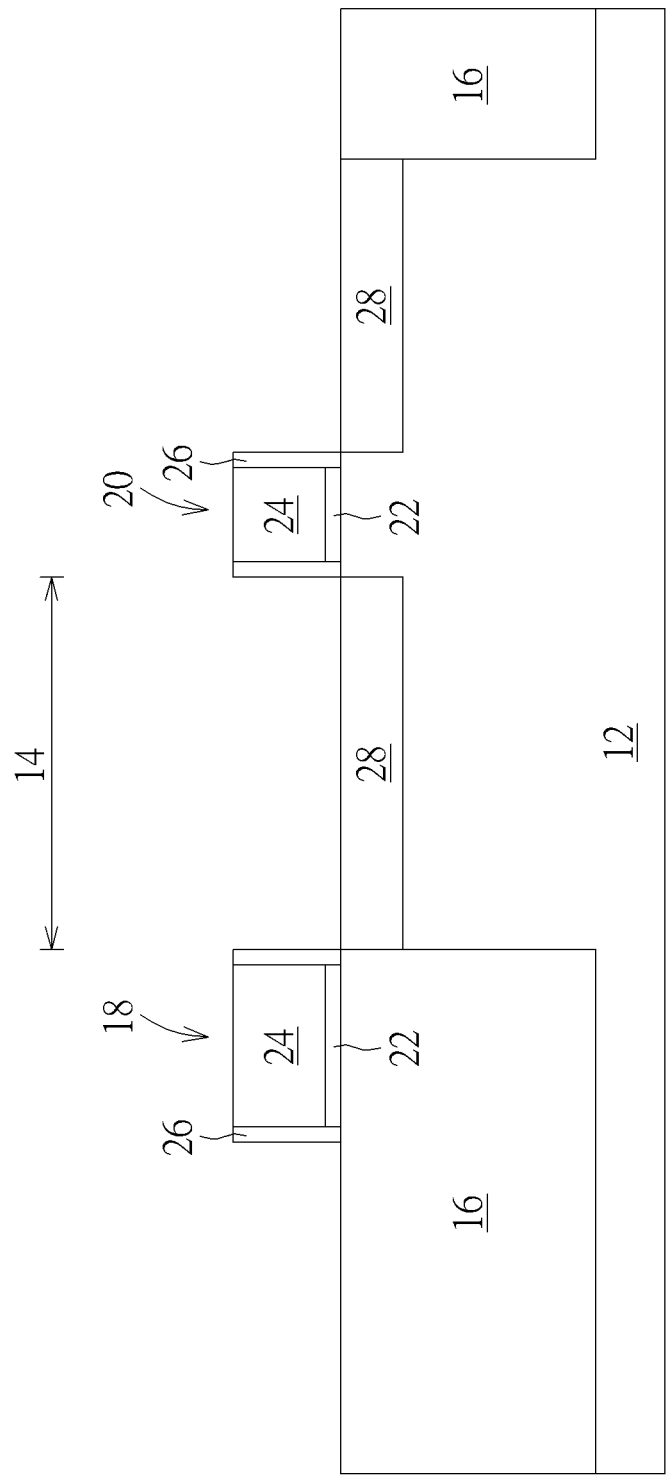
FIGS. 1-6 illustrate a method for fabricating a semiconductor device according to an embodiment of the present invention.

Referring to FIGS. 1-6, FIGS. 1-6 illustrate a method for fabricating a semiconductor device according to an embodiment of the present invention. As shown in FIG. 1, a substrate 12 such as a silicon substrate or silicon-on-insulator (SOI) substrate is provided, a diode region 14 could be defined on the substrate 12 for fabricating a Schottky diode in the later process, and then an insulating material such as silicon oxide is deposited in the substrate 12 to form a shallow trench isolation (STI) 16. It should be noted that even though this embodiment pertains to fabricate a planar device, according to other embodiment of the present invention, it would also be desirable to apply the process of this embodiment to fabricate non-planar devices such as fin field effect transistors (FinFET), which is also within the scope of the present invention.

According to an embodiment of the present invention, if a FinFET were to be fabricated, the fin-shaped structure could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a dummy gate or gate structures 18, 20 are formed on the substrate 12. In this embodiment, the formation of the gate structures 18, 20 could be accomplished by sequentially depositing a gate dielectric layer 22, a gate material layer 24, and a selective hard mask (not shown) on the substrate 12, conducting a pattern transfer process by using a patterned resist (not shown) as mask to remove part of the gate material layer 24 and part of the gate dielectric layer 20, and then stripping the patterned resist to form dummy gates or gate structures 18, 20 on the substrate 12. Each of the gate structures 18, 20 preferably includes a patterned gate dielectric layer 22 and a patterned material layer 24, in which the gate dielectric layer 22 includes silicon oxide and the gate material layer 24 includes polysilicon, but not limited thereto.

Next, at least a spacer 26 is formed on sidewalls of the gate structures 18, 20 and then an ion implantation process could be conducted without forming any patterned mask to form a doped region 28 in the substrate 12 adjacent to two sides of the gate structure 20. In this embodiment, the doped region 28 preferably includes n-type dopants or more specifically a n-region, in which the doped region 28 could be served as a lightly doped drain (LDD) for the metal-oxide semiconductor (MOS) transistor formed afterwards on the right side.

Figure 2:
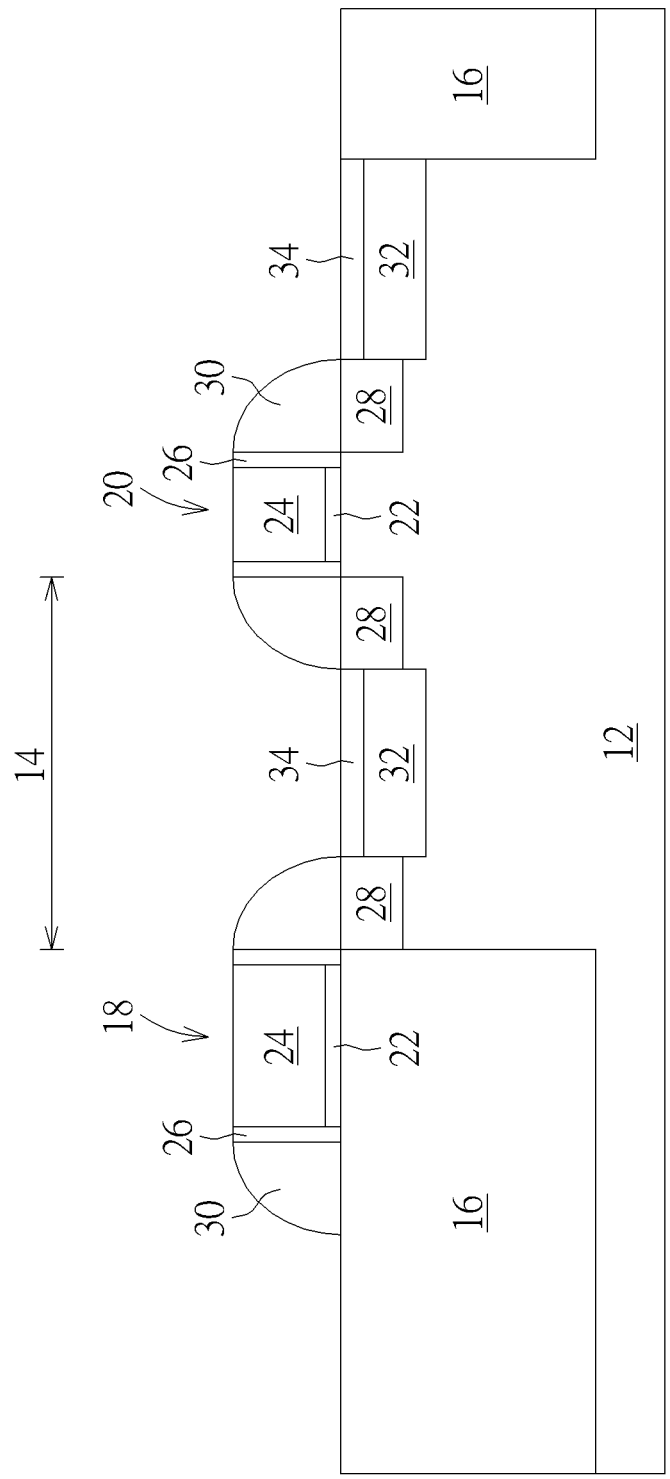

Next, as shown in FIG. 2, another spacer 30 is formed on sidewalls of the spacer 26, and another ion implantation process is conducted to form another doped region 32 in the substrate 12 adjacent to two sides of the spacer 30 adjacent to the gate structure 20. Preferably, the doped region 32 is a n+ region, which could be served as a source/drain region for the MOS transistor formed afterwards on the right side. In this embodiment, each of the spacers 26, 30 could be a single spacer or a composite spacer, each of the spacers 26, 30 could be made of same or different materials, and the spacers 26, 30 could be selected from the group consisting of $SiO_2$, SiN, SiON, and SiCN. The doped regions 28, 32 preferably include same conductive type, the concentration of the doped region 28 is less than the concentration of the doped region 32, and the bottom surface of the doped region 32 is lower than the bottom surface of the doped region 28. It should be noted that even though the doped regions 28, 32 are n-type regions in this embodiment, according to other embodiment of the present invention, the doped regions 28, 32 could also be p-type regions depending on the demand of the product. Next, a salicide process could be conducted to form silicide layers 34 on the surface of the doped region 32 or in the substrate 12 adjacent to two sides of the structure 20, in which the top surface of the silicide layers 34 could be even with or slightly higher than the top surface of the substrate 12 or doped region 28.

Figure 3:
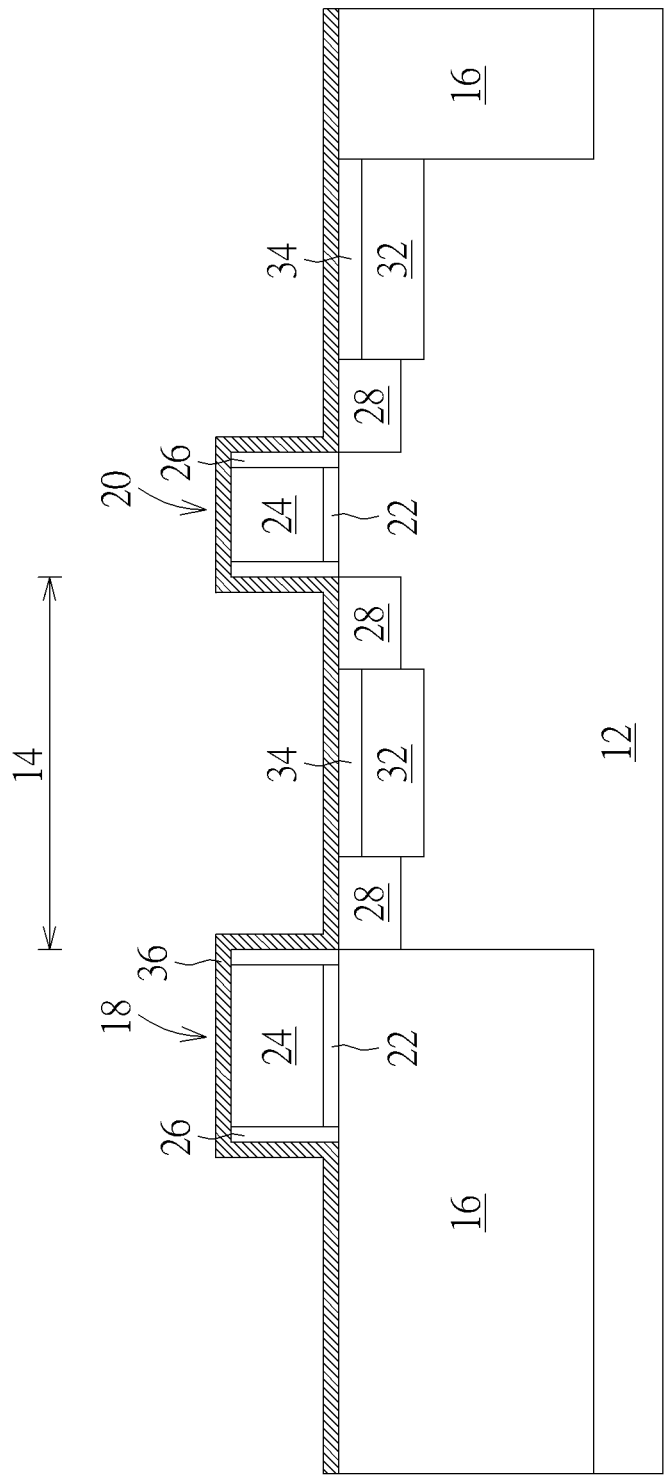

Next, as shown in FIG. 3, after the silicide layers 34 are formed, an etching process could be conducted to remove the spacers 30 for exposing the spacers 26 and the surface of the doped region 28 without removing any of the spacers 26. Since the spacers 30 are disposed to cover the surface of the doped regions 28 during the salicide process, no silicide layer 34 is formed on the surface of the doped regions 28 after the spacers 30 are removed. Next, a contact etch stop layer (CESL) 36 made of silicon nitride is formed on the STI 16 and the substrate 12 while covering the gate structures 18, 20.

Figure 4:
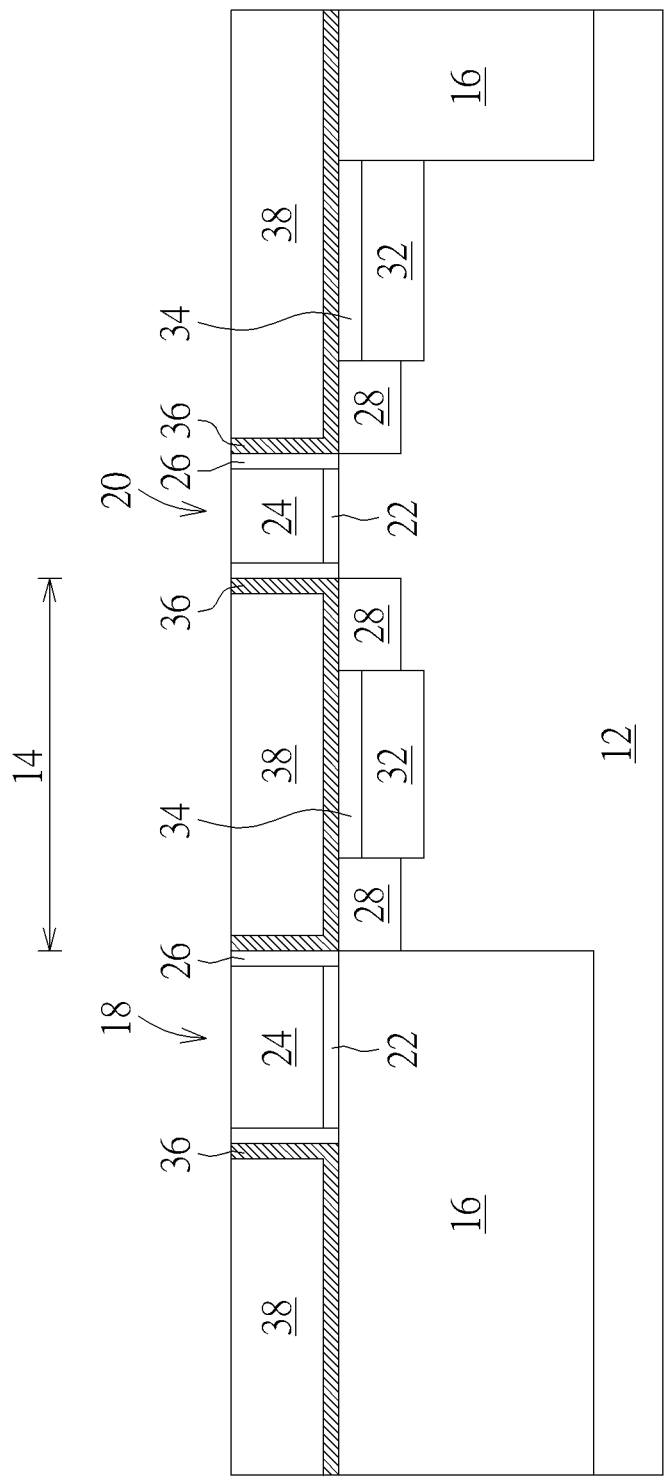

Next, as shown in FIG. 4, an interlayer dielectric (ILD) layer 38 is formed on the CESL 36 and a planarizing process such as a chemical mechanical polishing (CMP) process is conducted to remove part of the ILD layer 38 and part of the CESL 36 to expose the gate material layer 24 made of polysilicon so the top surfaces of the gate material layer 24 and ILD layer 38 are coplanar. In this embodiment, the CESL 36 could include silicon nitride while the ILD layer 38 could include silicon oxide, but not limited thereto.

Figure 5:
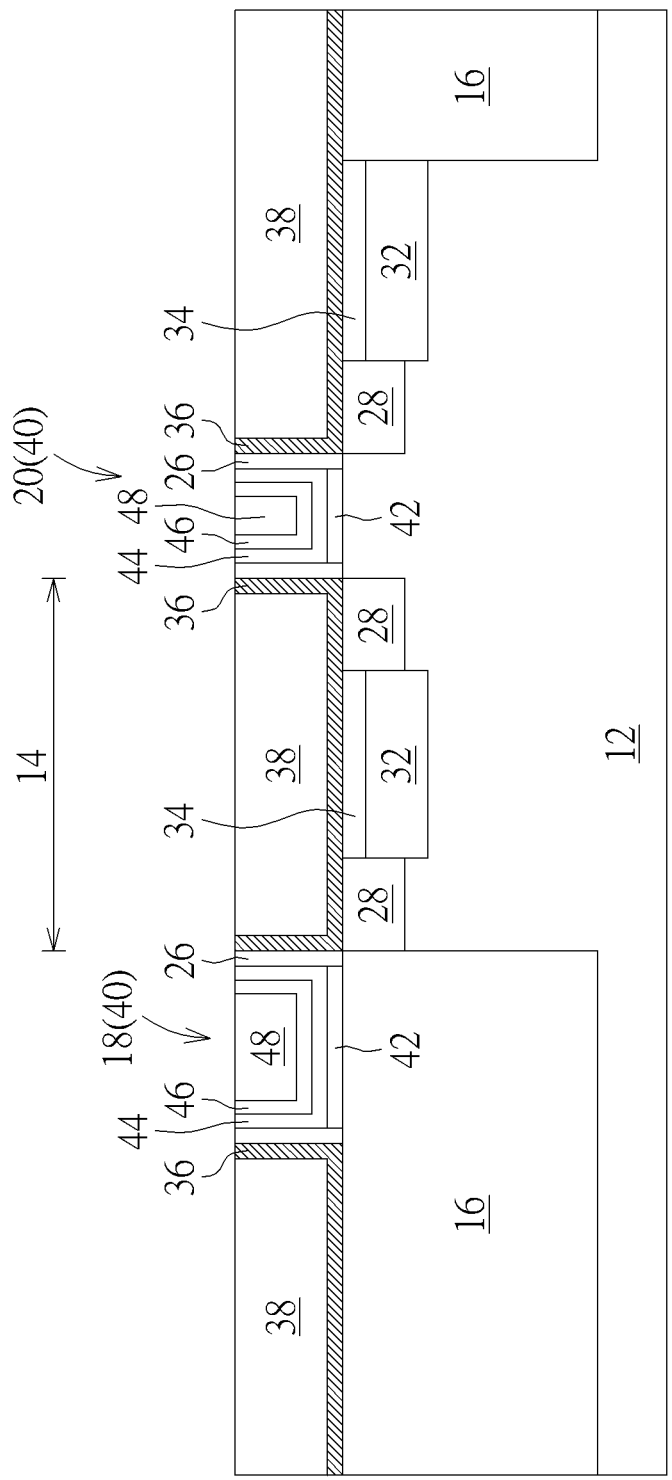

Next, as shown in FIG. 5, a replacement metal gate (RMG) process is conducted to transform the gate structures 18, 20 into metal gate 40. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 24 and even the gate dielectric layer 22 for forming recesses (not shown) in the ILD layer 38. Next, an interfacial layer 42, a high-k dielectric layer 44, a work function metal layer 46, and a low resistance metal layer 48 are formed in the recesses, and a planarizing process such as CMP is conducted to remove part of low resistance metal layer 48, part of work function metal layer 46, and part of high-k dielectric layer 44 for forming metal gates 40. In this embodiment, each of the gate structures or metal gates 40 fabricated through high-k last process of a gate last process preferably includes an interfacial layer 42 or gate dielectric layer, a U-shaped high-k dielectric layer 44, a U-shaped work function metal layer 46, and a low resistance metal layer 48. According to an embodiment of the present invention, part of the low resistance metal layer 48, part of the work function metal layer 46, and part of the high-k dielectric layer 44 could be removed thereafter to form recesses, a hard mask (not shown) is formed in each of the recesses, and a planarizing process such as CMP is conducted to remove part of the hard mask so that the top surfaces of the hard mask and ILD layer 38 are coplanar, which is also within the scope of the present invention.

In this embodiment, the high-k dielectric layer 44 is preferably selected from dielectric materials having dielectric constant (k value) larger than 4. For instance, the high-k dielectric layer 44 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 46 is formed for tuning the work function of the metal gate in accordance with the conductivity of the device. For an NMOS transistor, the work function metal layer 46 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 46 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 46 and the low resistance metal layer 48, in which the material of the barrier layer may include titanium (Ti), titanium nitride (TiN), tantalum (Ta) or tantalum nitride (TaN). Furthermore, the material of the low-resistance metal layer 48 may include copper (Cu), aluminum (Al), titanium aluminum (TiAl), cobalt tungsten phosphide (CoWP) or any combination thereof.

Figure 6:
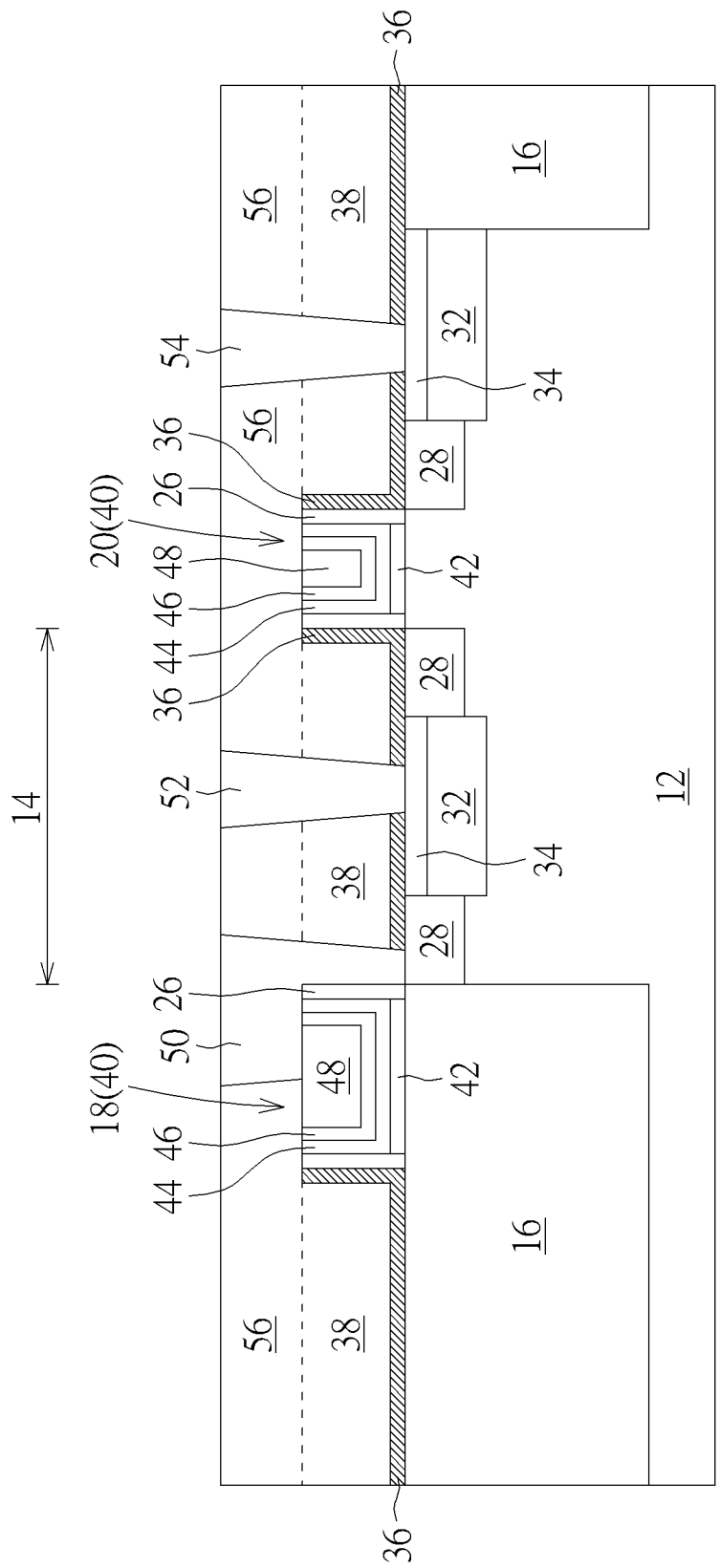

Next, as shown in FIG. 6, a contact plug formation could be conducted to form contact plugs 50, 52, 54 electrically connected to the doped regions 32 and/or the gate structure 18. In this embodiment, the formation of contact plugs 50, 52, 54 could be accomplished by first forming another ILD layer 56 on the ILD layer 38 and the metal gates 40, removing part of the ILD layers 38, 56 and part of the CESL 36 to form contact holes (not shown), and then depositing a barrier layer (not shown) and a metal layer into the contact holes. A planarizing process, such as CMP is then conducted to remove part of the metal layer, part of the barrier layer, and even part of the ILD layer 56 to form contact plugs 50, 52, 54, in which the top surface of the contact plugs 50, 52, 54 is even with the top surface of the ILD layer 56. In this embodiment, the ILD layers 38, 56 could include silicon oxide such as tetraethyl orthosilicate (TEOS), the barrier layer is selected from the group consisting of Ti, Ta, TiN, TaN, and WN, and the metal layer is selected from the group consisting of Al, Ti, Ta, W, Nb, Mo, and Cu. This completes the fabrication of a semiconductor device according to an embodiment of the present invention.

Referring again to FIG. 6, FIG. 6 illustrates a structural view of a semiconductor device according to an embodiment of the present invention. As shown in FIG. 6, the semiconductor device includes a STI 16 disposed in the substrate 12, a gate structure 18 disposed directly on top of the STI 16, a gate structure 20 disposed on the substrate 12 adjacent to the STI 16, doped regions 28, 32 disposed between the two gate structures 18, 20, a spacer 26 disposed adjacent to each of the gate structures 18, 20, a CESL 36 disposed on sidewalls of the spacer 26, an ILD layer 38 disposed on the CESL 36, a contact plug 50 disposed on the doped region 28 adjacent to the gate structure 18 and contact plugs 52, 54 disposed on the doped regions 32 adjacent to two sides of the gate structure 20.

Viewing from a more detailed perspective, the contact plug 50 immediately adjacent to the gate structure 18 includes a L-shape cross-section while directly contacting the top surface of the gate structure 18 and the doped region 28 adjacent to the gate structure 18, a CESL 36 is disposed on left side of the gate structure 18 while no CESL is disposed on right side of the gate structure 18, the doped regions 28, 32 disposed between the two gate structures 18, 20 preferably include same conductive type such as n-type, the concentration of the doped region 28 is slightly less than the concentration of the doped region 32, and the bottom surface of the doped region 32 is slightly lower than the bottom surface of the doped region 28. Preferably, the contact plug 50 connected to the doped region 28 on the diode region 14 could further connect to an anode or cathode while the contact plug 52 connected to the doped region 32 on the diode region 14 could also connect to an anode or cathode thereby constituting a Schottky diode.

It should be noted that even though the contact plug 50 contacts both the top surface of the gate structure 18 and the doped region 28 immediately adjacent to the gate structure 18 in this embodiment, according to other embodiment of the present invention, the left sidewall of the contact plug 50 could also be slightly retracted inward to align with the right sidewall of the spacer 26 adjacent to right side of the gate structure 18 so that the contact plug 50 only contacts the doped region 28 but not contacting the top surfaces of the spacer 26 and the gate structure 18 directly. Alternatively, according to yet another embodiment of the present invention, the left sidewall of the contact plug 50 could also be aligned with right sidewall of the gate structure 18 so that the contact plug 50 contacts the doped region 28 and right sidewall and top surface of the spacer 26 but not contacting the top surface of the gate structure 18, which is also within the scope of the present invention.

Overall, the present invention first forms a gate structure on the STI and another gate structure on the adjacent substrate, uses a first spacer 28 to define a first doped region such as the doped region 28, and then uses a second spacer 30 to define a second doped region such as the doped region 32 so that the overall length or width of the two doped regions 28, 32 or the Schottky diode formed afterwards could be adjusted. After removing the second spacer 30, contact plugs are formed to electrically connect the doped regions 28 and 32 respectively for serving as anode or cathode of a Schottky diode. By using this design, the overall area required by the Schottky diode could be effectively minimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a shallow trench isolation (STI) in a substrate;
a first gate structure on the substrate and adjacent to the STI;
a first doped region between the first gate structure and the STI;
a second doped region between the first doped region and the first gate structure and contacting the first doped region directly;
a first contact plug on the first doped region; and
a second contact plug on the second doped region.

2. The semiconductor device of claim 1, further comprising:
a second gate structure on the STI;
a spacer adjacent to the first gate structure and the second gate structure;
a contact etch stop layer (CESL) adjacent to the first gate structure and the second gate structure; and
an interlayer dielectric (ILD) layer on the CESL.

3. The semiconductor device of claim 2, wherein the first contact plug is on the second gate structure and the first doped region.

4. The semiconductor device of claim 2, wherein the second gate structure comprises a second metal gate.

5. The semiconductor device of claim 1, wherein the first gate structure comprises a first metal gate.

6. The semiconductor device of claim 1, wherein the first contact plug comprises a L-shape.

7. The semiconductor device of claim 1, further comprising a silicide layer on the second doped region.

8. The semiconductor device of claim 1, wherein the first doped region and the second doped region comprise same conductive type.

9. The semiconductor device of claim 1, wherein a concentration of the first doped region is less than a concentration of the second doped region.

10. The semiconductor device of claim 1, wherein a bottom surface of the second doped region is lower than a bottom surface of the first doped region.

* * * * *